(12) United States Patent
Lin

(10) Patent No.: US 7,157,191 B2
(45) Date of Patent: Jan. 2, 2007

(54) SINGLE TRENCH REPAIR METHOD WITH ETCHED QUARTZ FOR ATTENUATED PHASE SHIFTING MASK

(75) Inventor: Cheng-Ming Lin, Siluo Township, Yulin County (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 200 days.

(21) Appl. No.: 10/755,500

(22) Filed: Jan. 12, 2004

(65) Prior Publication Data

US 2005/0153214 A1    Jul. 14, 2005

(51) Int. Cl.
*G01F 9/00* (2006.01)
(52) U.S. Cl. ......................................................... 430/5
(58) Field of Classification Search .................... 430/5, 430/322–324
See application file for complete search history.

(56) References Cited

U.S. PATENT DOCUMENTS

| | | | |
|---|---|---|---|
| 5,272,024 A | 12/1993 | Lin | 430/5 |
| 6,016,357 A | 1/2000 | Neary et al. | 382/144 |
| 6,114,073 A | 9/2000 | Yang | 430/5 |
| 6,159,641 A | 12/2000 | Baum et al. | 430/5 |
| 6,261,723 B1 | 7/2001 | George et al. | 430/5 |
| 6,277,526 B1 | 8/2001 | Yang | 430/5 |
| 6,361,904 B1 | 3/2002 | Chiu | 430/5 |
| 6,558,854 B1 * | 5/2003 | Pierrat et al. | 430/5 |
| 6,902,851 B1 * | 6/2005 | Babcock et al. | 430/5 |
| 2002/0058188 A1 * | 5/2002 | Iwasaki et al. | 430/5 |
| 2005/0058912 A1 * | 3/2005 | Lin et al. | 430/5 |

* cited by examiner

*Primary Examiner*—S. Rosasco
(74) *Attorney, Agent, or Firm*—Thomas, Kayden, Horstemeyer & Risley (57) ABSTRACT

In accordance with the objectives of the invention a new method is provided for the repair of an attenuated phase shifting mask having a contact pattern. The invention etches a single trench in the quartz substrate of the phase shifter mask and removes the impact of a void in the phase shifter material. Alternatively, the invention provides for first conventionally restoring the original dimensions of a contact hole in which a pinhole is present and then etching a single or a double trench in the exposed substrate of the restored contact opening.

18 Claims, 8 Drawing Sheets

SINGLE TRENCH REPAIR METHOD WITH ETCHED QUARTZ FOR ATTENUATED PHASE SHIFTING MASK

BACKGROUND OF THE INVENTION (1) Field of the Invention

The invention relates to the fabrication of integrated circuit devices, and more particularly, to a method of creating an attenuated phase shifting mask by methods of repair thereof, whereby effects of pinholes are removed.

(2) Description of the Prior Art

During and for the fabrication of semiconductor devices optical projection tools are an integral part of the optical lithography technology that is fundamental to the creation of semiconductor devices and devices features. The optical projection tools conventionally contain an electromagnetic light source, a configuration of lenses and an optical projection mask that contains a replica of the image that is to be created. The image of the mask is, with the interference and the help of the configuration of lenses, projected onto the surface over which the image contained in the mask is to be created.

Semiconductor device improvements are traditionally and consistently achieved by sharp reductions in device feature dimensions, resulting in increasing device densities, which imposes on the supporting optical lithography technology the need for a continuing ability to provide images of smaller dimensions while maintaining image resolution.

Conventional photolithography masks are limited in this respect due to the increasingly smaller distance between adjacent light projections, which causes increased interference between closely spaced light projections. This has led to the development of phase-shifting masks, where effects of closeness of projecting light rays are cancelled by controlling the relative phase relationship between closely adjacent rays of light.

A phase shifting mask is provided with a layer of phase shifter material that is created in a pattern over the substrate of the mask. The patterned layer of phase shifter material causes the light that passes through the layer of phase shifter material to be out-of-phase by 180° with respect to the light that passes through the substrate over which the patterned layer of phase shifter material has been created. This results in a corrective action between the light that passes through the transparent substrate of the phase shifter mask and the light that passes through the layer of phase shifter material, this corrective action allowing further reductions in the images that are created using the phase shifter mask. Optionally, a phase shifter mask may also be provided with a patterned layer of opaque material such as chrome to further enhance the mask application.

Phase shifting masks are generally created using methods of photolithography. These methods at times lead to the introduction of fabrication defects in the surfaces of the created mask. For a phase shifter mask to be operational, especially considering the deep-submicron device features that must be created using the phase shifter mask, surface irregularities, such as voids occurring in a layer of phase shifter material, must be prevented or corrected if present. Any surface irregularity that occurs in any of the layers of the phase shifter mask, including the substrate of the phase shifter mask, results in a disruption of the there-through transmitted light and therefore in an interruption of a coherent interaction between the phase controlled light that is transmitted through the phase shifter mask.

Cost considerations relating to the creation of phase shifter masks lead to the need for repairing phase shifter masks that show any defects that may negatively affect the desired performance characteristics of the phase shifter mask. The invention addresses this concern and provides a method for the repair of attenuated phase shifter masks with a contact pattern.

U.S. Pat. No. 6,159,641 (Baume et al.) shows a method for repairing masks.

U.S. Pat. No. 6,016,357 (Neary et al.) discloses a method to repair PSMS.

U.S. Pat. No. 6,114,073 (Yang) shows a method to repair PSMS.

U.S. Pat. No. 5,272,024 (Lin) discloses a structure and method for PSM repair.

U.S. Pat. No. 6,361,904 B1 (Chiu) shows a method for repairing the Shifter Layer of an alternating phase shifter mask.

SUMMARY OF THE INVENTION

A principle objective of the invention is to repair an attenuated phase shifting mask in a cost-effective manner.

Another objective of the invention is to repair an attenuated phase shifting mask without impairing operational phase shifting requirements of the mask.

Yet another objective of the invention is to repair an attenuated phase shifting mask that is independent of the wavelength for which the mask is designed and used.

In accordance with the objectives of the invention a new method is provided for the repair of an attenuated phase shifting mask having a contact pattern. The attenuated phase shifting mask is frequently used for the creation of contact holes or via openings and as such has a surface area of no phase shift and a surface area of 180° phase shift. Conventionally, when a surface defect such as a pinhole occurs in the layer of phase shifter material of an attenuated phase shifter mask, an opaque material is deposited over the pinhole. This opaque material however interrupts the desired and conventional operational characteristics of light transmission of the attenuated phase shifter mask. To avoid such an interruption, the invention etches a single trench in the surface of the quartz substrate of the phase shifter mask and removes the impact of a void in the phase shifter material. Alternatively, the invention provides for first conventionally restoring the original dimensions of a contact hole in which a pinhole is present and then etching a single or a double trench in the exposed substrate of the restored contact opening.

DESCRIPTION OF THE PREFERRED EMBODIMENTS

First are highlighted a number of statements of purpose that relate to the invention:

1. attenuated phase shifter masks are used for the patterning of layers of contact openings
2. conventionally, a commercial repair apparatus is used to deposit an opaque material over a pinhole defect in a layer of phase shifter material; this layer of opaque material however is in the application of a phase shifter mask equal to an opaque layer, such as a layer of chrome, and does therefore not provide a phase shift of 180 degrees to light passing through the attenuate phase shifter mask
3. if the surface of a quartz substrate is etched, the phase shifting function of the attenuated phase shifter mask is maintained around the perimeter of the contact openings, and
4. it is the observed conclusion of the invention that, in order to repair a pinhole defect in a contact area, a single trench etched in the surface of the quartz substrate can be created such that a phase shift of 180 degrees can be provided to light passing through the attenuated phase shifter mask.

Figure 1A:
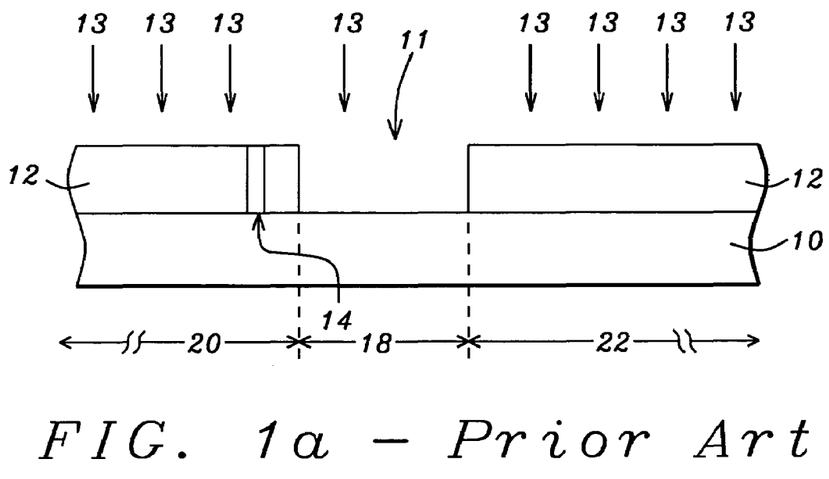
FIGS. 1a through 1c highlight conventional methods of repairing a pinhole in a layer of phase shifter material.
Figure 1B:
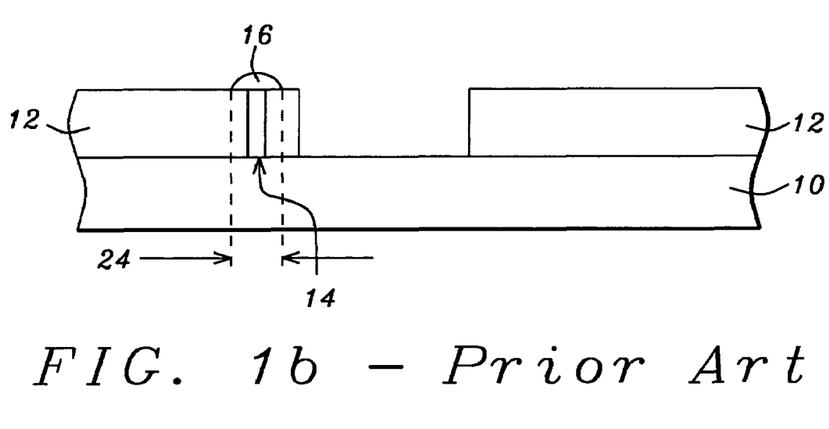
Figure 1C:
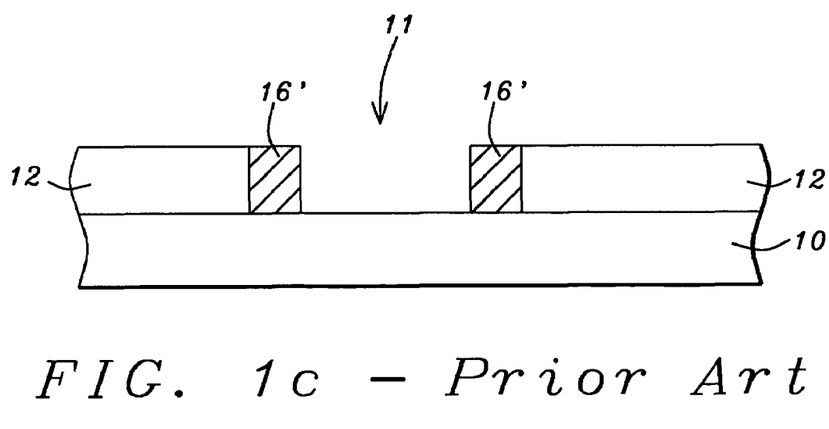

A conventional method of repairing a pinhole over the surface of a quartz substrate, which is used as the substrate for an attenuated phase shifter mask, is first highlighted using FIGS. 1a through 1c for this purpose.

The cross section that is shown in FIG. 1a shows a substrate 10, conventionally comprising quartz, over the surface of which a layer 12 of phase shifter material, such as MoSiON, has been deposited. The layer 12 of MoSiON has been patterned and etched, creating an opening 11 through the layer 12 of MoSiON, exposing the quartz substrate 10. The phase shifting material 12 provides a 180° phase shift to the light that passes through this layer 12, the phase of the light that passes through the quartz substrate 10 without passing through the layer 12 of phase shifter material is not affected and therefore has a 0° phase shift.

Pinhole 14 in the layer 12 of phase shifter material must be repaired, a repair that conventionally is performed by, as shown in the cross section of FIG. 1b, depositing a small amount 16 of opaque material over the pinhole 14. This method has a number of disadvantages since the opaque material 16 acts as a deposition of chrome and therefore affects the light transmission characteristics of the layer 12 over which the opaque material 16 is deposited.

Some of the important parameters of light transmission and phase shifting that are provided by an attenuated phase shifter mask are now highlighted, using parameters that have been highlighted in FIG. 1a for this purpose, as follows:

for regions 18, which are the regions of the attenuated phase shifter mask underlying the opening 11 created through the layer 12 of phase shifter material, the light transmission of the light provided by light source 13 is about 100%, the phase shift that is introduced to this light is about 0°, and for regions 20 and 22, underlying the patterned and etched layer 12 of phase shifter material, these parameters are: light transmission of about 6%, phase shifting of about 180°.

From the cross section that is shown in FIG. 1b, it can be seen that these characteristics are disturbed for region 24, underlying the deposited layer 16, where for region 24 the light transmission has been reduced while the phase shift is difficult to predict.

As a further demonstration of the repair that is conventionally performed to repair a pinhole in the layer of phase shifter material, FIG. 1c shows a cross section wherein the phase shifter material 12 has been symmetrically removed around the perimeter of the contact opening 11. The removed phase shifter material has been replaced with opaque material 16'. The replacement opaque material 16' is known to peel from the surface of the substrate 10 over which it has been deposited.

To avoid the above indicated negative effects that are introduced by conventional methods of repairing a pinhole or any other opaque deficiency over the substrate 10 of an attenuated phase shifter mask, the invention provides for etching a single trench into the substrate in areas surrounding the pinhole.

Comparisons of light transmission and phase shifting characteristics are first made for a number of configurations of quartz mask and thereover deposited layers of opaque material, using FIGS. 2 through 6 for this purpose.

Figure 2:
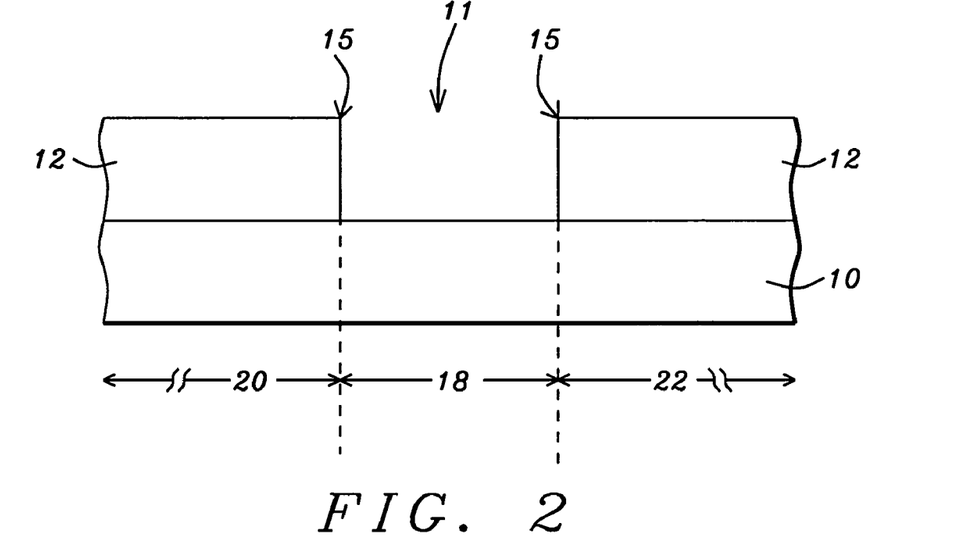
FIGS. 2 through 5 highlight characteristics of phase shifting and light transmission for various combinations of deposition of opaque material and the creation of single and double trenches etched in the surface of the quartz substrate of the attenuated phase shifter mask.

Referring first to the cross section shown in FIG. 2, this represents a normal attenuate phase shifter mask and is used to highlight the relation between phase shift and light transmission for the various surface regions of the conventional attenuated phase shifter mask.

Specifically highlighted in the cross section of FIG. 2 are:
10, the transparent substrate of the attenuated phase shifter mask, typically comprising quartz
12, the patterned and etched layer of phase shifter material, typically comprising MoSiON; other phase shifter materials that can be applied are CrO, ZrSiO$_3$ or SiON
11, the opening created through the layer 12 of phase shifter material, exposing substrate 10
18, the region of the substrate 10 that aligns with opening 11, light passes through the attenuated phase shifter mask confined by region 18, a 0° phase shift is experienced by the light that passes through the attenuated phase shifter mask that is bounded by opening 11
regions 20 and 22, phase shift about 180°, about 6% of the incident light that strikes the surface of layers 12 passes through these layers.

Figure 3:
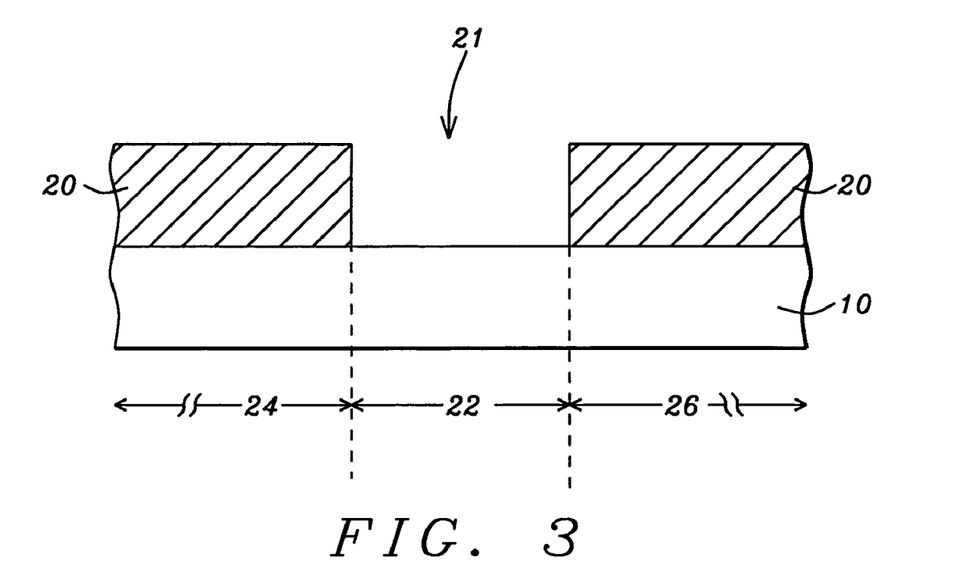

Referring now to the cross section that is shown in FIG. 3, there is shown:
10, the transparent substrate of the attenuated phase shifter mask, typically comprising quartz
20, the patterned and etched layer of opaque material
21, the opening created through the layer 20 of opaque material, exposing substrate 10
22, the region of the substrate 10 that aligns with opening 21, 100% light passes through the attenuated phase shifter mask confined by region 22, a 0° phase shift is experienced by the light that passes through the attenuated phase shifter mask that is bounded by opening 21
regions 24 and 26, phase shift is difficult to control and predict, no incident light passes through the patterned layer 20.

Figure 4:
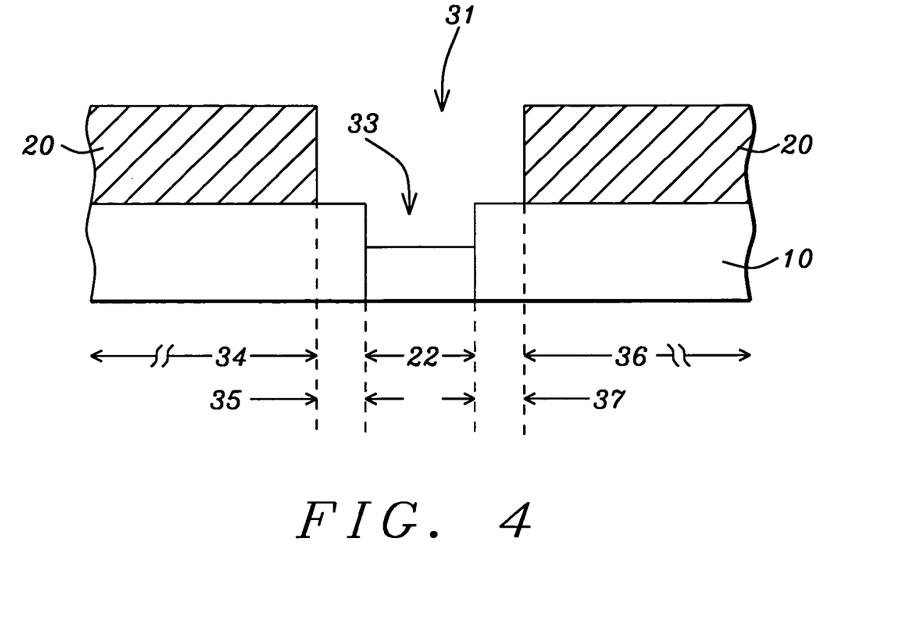

Referring now to the cross section that is shown in FIG. 4 which shows a single trench etched in the surface of the quartz substrate, there is shown:

10, the transparent substrate of the attenuated phase shifter mask, typically comprising quartz 20, the patterned and etched layer of opaque material 31, an opening created through the layer 20 of opaque material, exposing the surface of substrate 10

33, a single trench etched in the surface of substrate 20 regions 34 and 36, phase shift is difficult to control and predict, no incident light passes through layers 20 regions 35 and 37, phase shift is zero, incident light passes 100% through the substrate 10 regions 32, phase shift 180 degrees, incident light passes 100% through the substrate 10.

Figure 5:
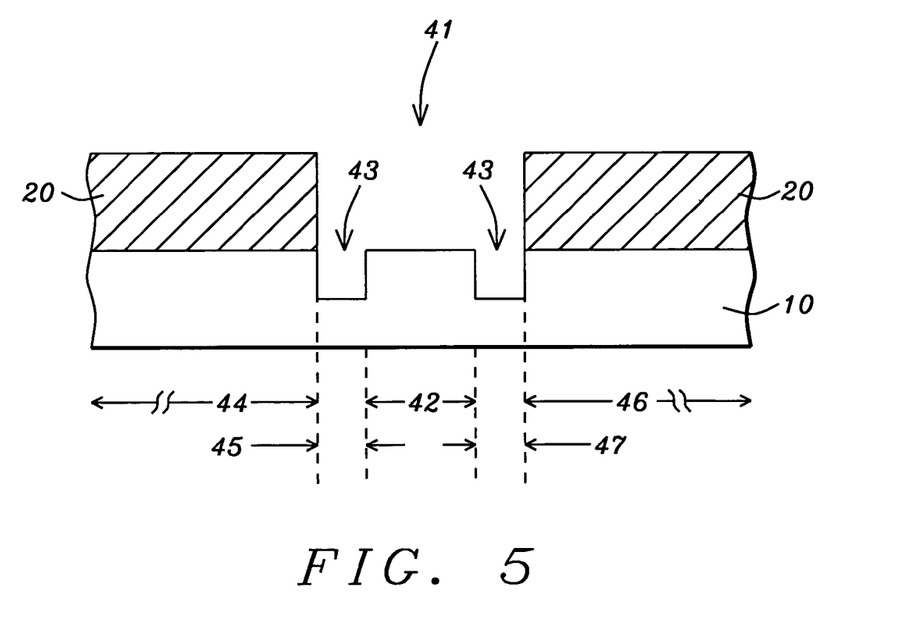

Referring now to the cross section that is shown in FIG. 5, which represents a double trench etched in the surface of the quartz substrate, there is shown:

10, the transparent substrate of the attenuated phase shifter mask, typically comprising quartz 20, the patterned and etched layer of opaque material 41, an opening created through the layer 20 of opaque material, exposing substrate 10

43, two trenches etched in the surface of substrate 20 regions 44 and 46, phase shift is difficult to control and predict, no incident light passes through the patterned layer 20 regions 45 and 47, phase shift is 180 degrees, incident light passes 100% through the substrate 10 region 42, phase shift 180 degrees, incident light passes about 100% through the substrate 10.

From the above a number of relevant observations can be made.

Relating to the single trench etch as shown in the cross section of FIG. 4, the following applies:

the etched area 33 is centered within the area of the contact pattern, which is represented by opening 31 created through the layer 20 of opaque material the etched width of the etched single trench 33 approaches the critical diameter of the contact area, exposed through the opening 31 the etching of the quartz substrate is limited to a one-time etch per contact area the width of the etched trench exceeds the combined width of the double trenches, which are shown in the cross section of FIG. 5 compared to the etching of the double trenches (43, shown in the cross section of FIG. 5), the etching of the single trench (33, shown in the cross section of FIG. 4) is easy to control in etch width and etch location, and relative to the deposited material 20 in combination with the double trench etch, the single trench etch can be expected to provided a larger repair window.

Relating to the double trench etch as shown in the cross section of FIG. 5, the following applies:

the etched area 43 is at the edge of the contact pattern, which is represented by opening 41 created through the layer 20 of opaque material the etched width 45/47 of the etched single trench 43 is smaller than the critical diameter of the contact area, exposed through the opening 41, a suitable combined etch width 45/47 must be experimentally determined the etch of the double trenches 43 must be located around the perimeter of the contact pattern 41 the width (45+47, shown in the cross section of FIG. 5) of the etched double trenches 43 is less than the width (32, shown in the cross section of FIG. 4) of the single trench 33 compared to the etching of the single trench 33, the etching of the double trenches 43 is difficult to control in etch width and etch location, and the etch of double trenches 43 requires four steps of etch from which follows that the creation of the double trenches 43 is a process that is more difficult to control.

The single trench etch is therefore the preferred method of repairing a pinhole defect in the layer of phase shifter material as has been highlighted in the cross section of FIG. 4. That is the defect is assumed to be present in the region that is bounded by the opening 31 over the surface of the quartz substrate, the etch therefore removes the phase shifter material from this surface region and further etches into the surface of substrate 10, as has been highlighted in the cross section of FIG. 4 with the trench 33 etched into the surface of substrate 10. The phase relationships and light passing capabilities are, with the etch of trench 33, modified as follows:

The phase shift of 180° is achieved by selecting the depth, of the created trench 33 such that, for a given incident light wavelength, an appropriate amount of quartz is removed. The light passing through the remaining layer of quartz underlying the created trenches can be provided with a phase shift of 180° in this manner.

For instance, for an incident light wavelength of 248 nm, the thickness of the quartz underlying the created trench must be about 238.5 nm. For an incident light wavelength of 193 nm, the thickness of the quartz underlying the created trench must be about 172.3 nm.

The following can be concluded:

for proper operation of a phase shifter mask, capabilities of light transmission and phase shifting must be controlled in conventionally repairing a pinhole or a void in the phase shifter material of a phase shifter mask, the pinhole is covered with an opaque material; where previously this region of the phase shifter material has about 6% light transmission and 180 degree phase shift, the repaired region has 6% light transmission and unknown degree phase shift by removing the phase shifter material that contains the pinhole or void and by in addition etching into the surface of the quartz substrate, the effectiveness of the phase shifter material is not altered since, see FIG. 4 for the single trench etch, the required characteristics of 100% light transmission and 0 degrees phase shift are maintained for surface areas 35 and 37 while the etch for single trench 33, surface area 32, the light transmission characteristics through this surface are to still 100% light transmission but now having, as determined by the depth of the trench 33, a 180 degree phase shift.

This latter alteration of the contact region, bounded by opening 31, does not detract from the functionality of the contact surface. The exposure (of 100% light transmission) remains in effect over the entire contact area while the light transmitted through region 32 of the quartz substrate has a not detrimental phase shift of 180 degrees.

The contact region will continue to be exposed (in light intensity) as desired, the fact that the light within the area of exposure now has a phase shift of zero degrees and a phase shift of 180 degrees there-within does not affect the exposure of the contact area. It would, if beneficially applied, further minimize negative effects of light interference within the exposed contact area.

For further clarification and extension of the invention, FIGS. 6a through 10b are presented.

Figure 6A:
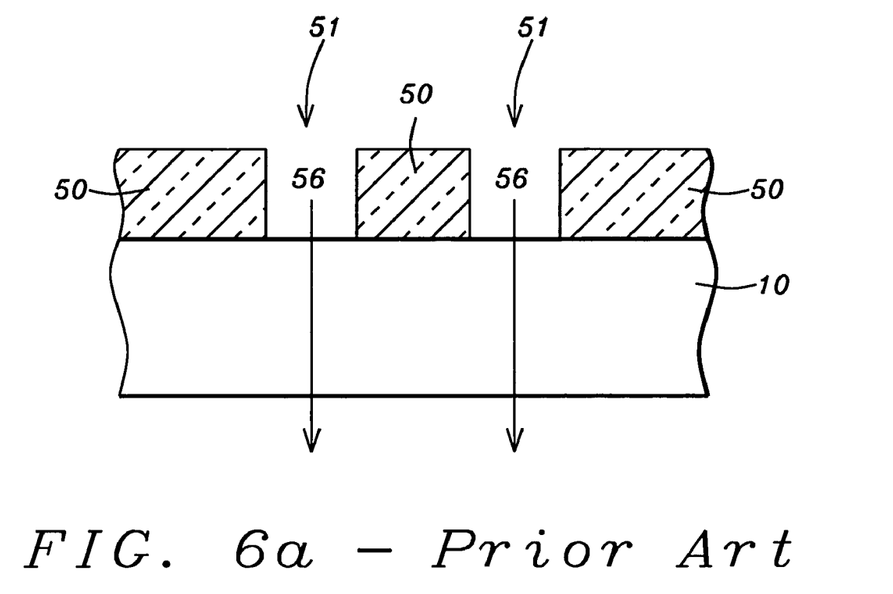
FIGS. 6a and 6b show a normal attenuated phase shifter mask in which no pinhole is present.
Figure 6B:
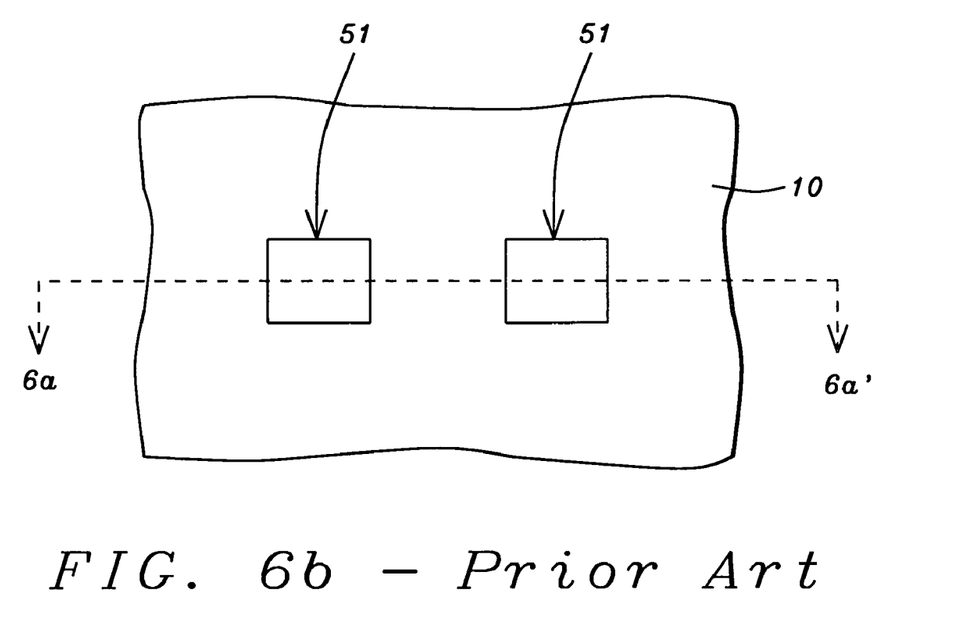

Shown in FIG. 6a is a cross section of a substrate 10 of an attenuated phase shifter mask over which a patterned layer 50 of shifter material has been created. Openings 51 created through the layer 50 of phase shifter material are normal contact openings for pattern exposure by incident light 56. FIG. 6b shows a top view corresponding to the cross section of FIG. 6a, the cross section shown in FIG. 6a has been taken along the line 6a–6a' shown in FIG. 6b. It is clear that the FIGS. 6a and 6b relate to a normal pattern, that is a pattern in which no pinhole defect is present.

Figure 7A:
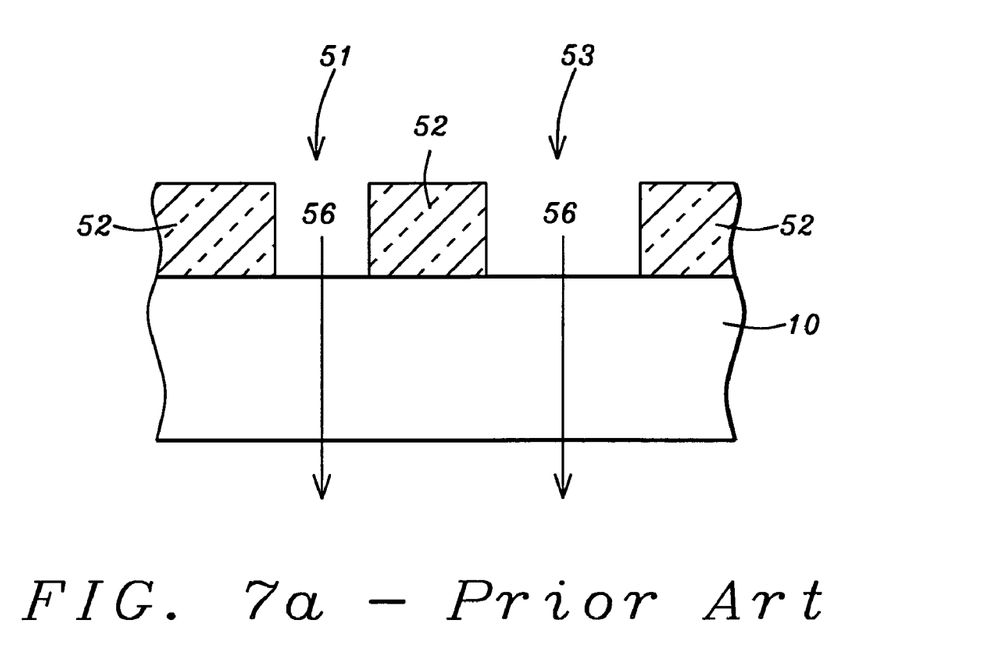
FIGS. 7a and 7b show the occurrence of a pinhole in a contact opening.
Figure 7B:
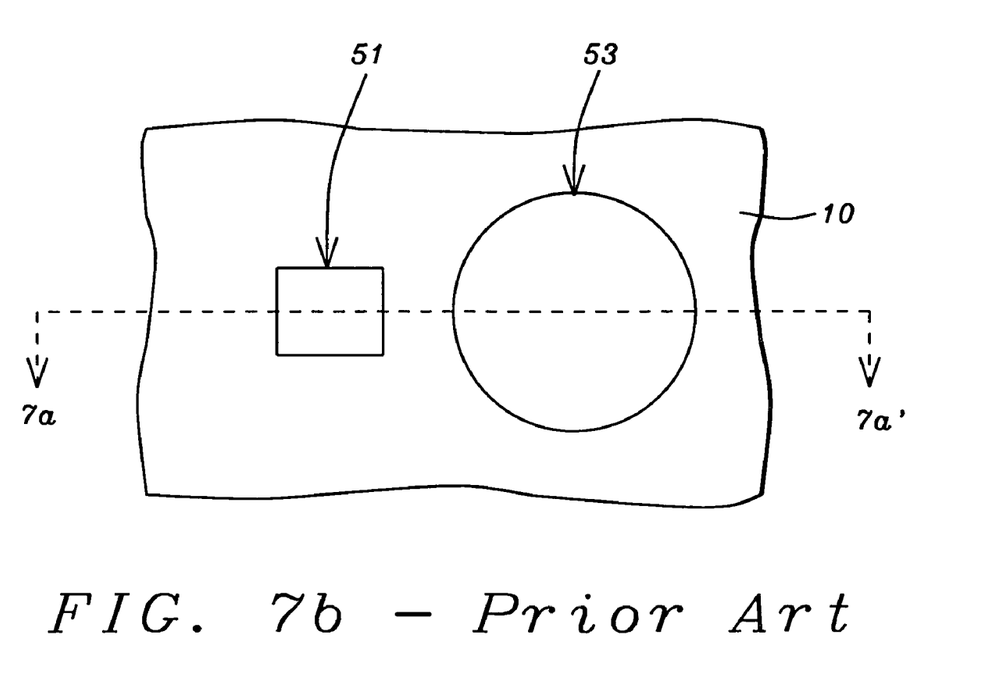

Shown in FIG. 7a is a cross section of a substrate 10 of a attenuated phase shifter mask over which a patterned layer 52 of shifter material has been created. Opening 51 created through the layer 52 of phase shifter material is a normal contact opening for pattern exposure by incident light 56. Opening 53 created through the layer 52 of phase shifter material is a contact opening in which a pinhole is present, as is obvious from the deformed and considerably larger diameter of opening 53 when compared with the cross section of opening 51. FIG. 7b shows a top view corresponding to the cross section of FIG. 7a, the cross section shown in FIG. 7a has been taken along the line 7a–7a' shown in FIG. 7b.

Figure 8A:
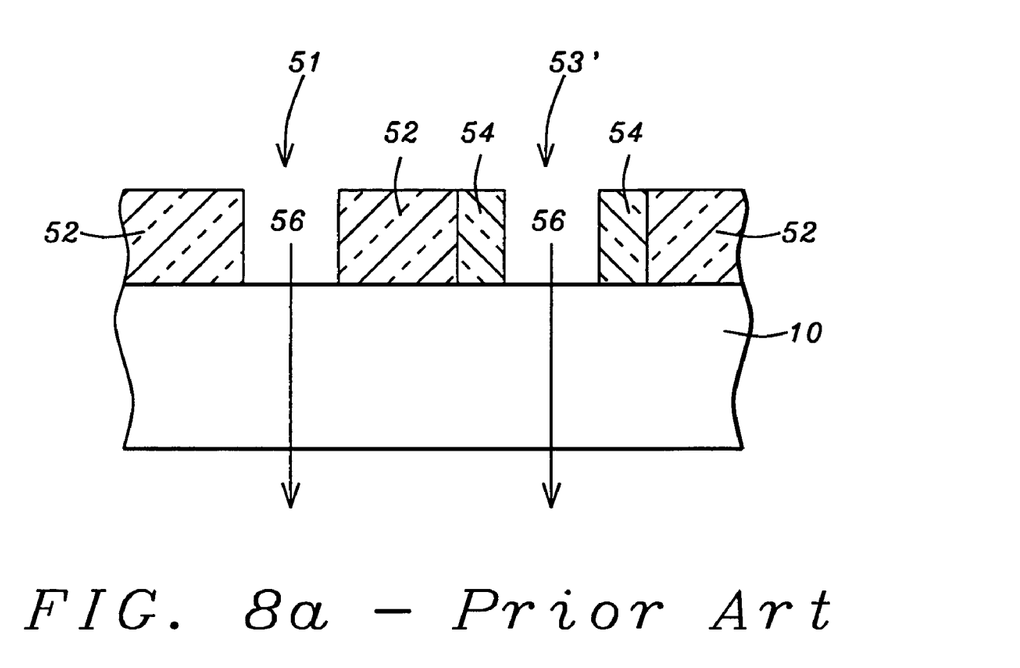
FIGS. 8a and 8b show the conventional repair of a pinhole by depositing a layer of material around the perimeter of a contact opening in which the pinhole is present.
Figure 8B:
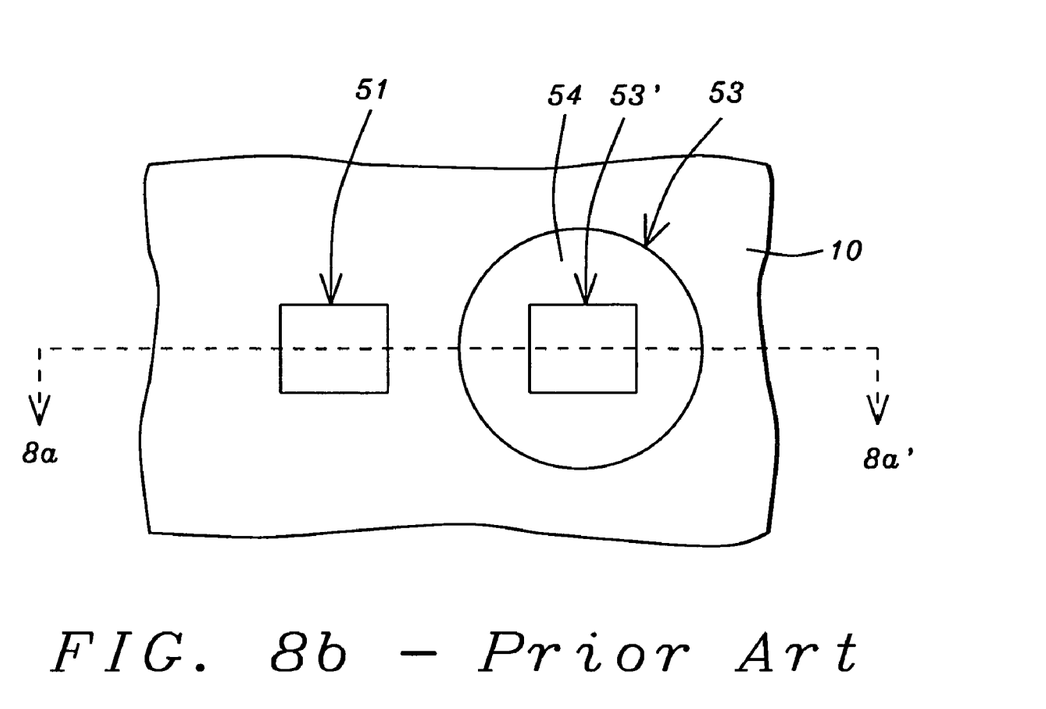

Referring now to FIGS. 8a and 8b, therein is shown how a pinhole is conventionally repaired by deposition of an opaque material 54 around the perimeter of opening 53, restoring the cross section of opening 53 to a cross section 53', which is equal to a cross section of the normal contact opening 51.

As has previously been pointed out, the repaired contact opening 53' has, after the highlighted repair has been completed by the addition of layer 54, lost the phase shifting function while at the same time the depth of focus and the process window of the opening 53' is smaller than the normal contact opening 51.

FIG. 8b shows a top view corresponding to the cross section of FIG. 8a, the cross section shown in FIG. 8a has been taken along the line 8a–8a' shown in FIG. 8b.

Figure 9A:
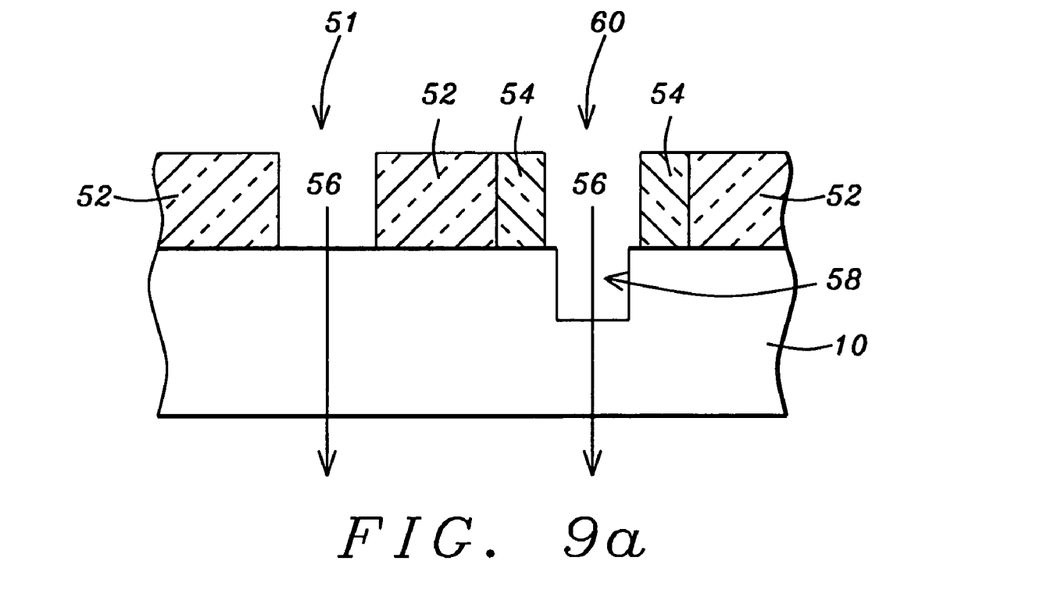
FIGS. 9a and 9b show a first repair of the invention by providing a single trench etch, in the exposed surface of the substrate (of the attenuated phase shifter mask) of the contact opening in which the pinhole is present.
Figure 9B:
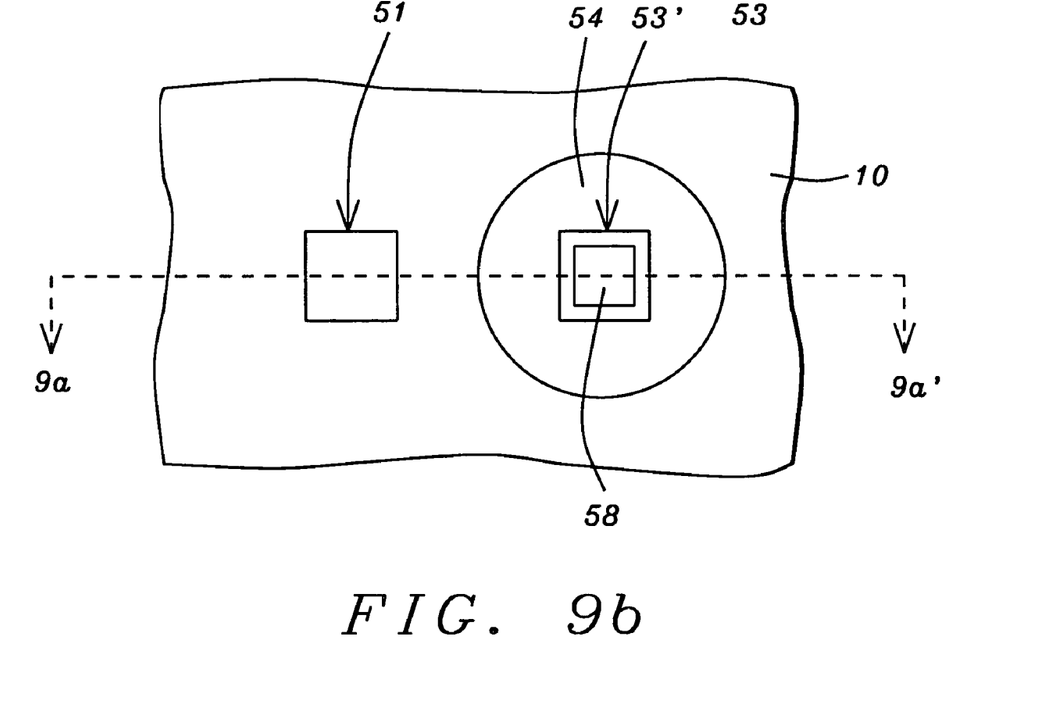

Referring now to FIGS. 9a and 9b, there is shown how, in the structure that has previously been discussed using FIGS. 8a and 8b, a single trench 58 has been etched into the surface of substrate 10 where the substrate 10 is exposed in opening 53', creating the opening 60 which comprises the single trench etch 58. For this method of repairing the pinhole 53, as shown in FIGS. 9a and 9b, the results are that the contact created by the repaired opening 60 provides the required phase shifting function while the depth of focus and the process window of the opening 60 are the same as the normal contact opening 51.

FIG. 9b shows a top view corresponding to the cross section of FIG. 9a, the cross section shown in FIG. 9a has been taken along the line 9a–9a' shown in FIG. 9b.

Figure 10A:
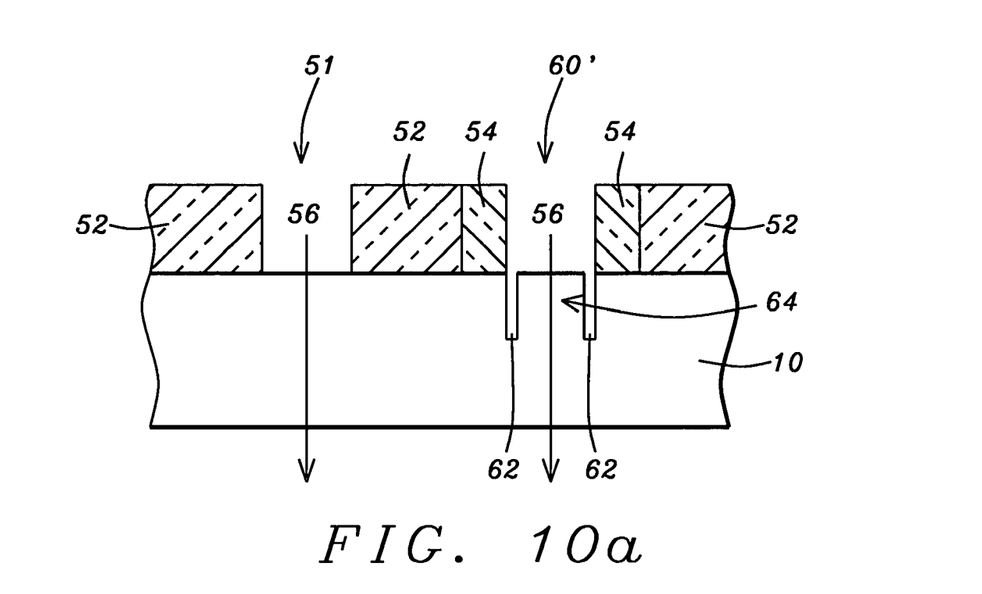
FIGS. 10a and 10b show a second repair of the invention by providing a double trench etch in the exposed surface of the substrate (of the attenuated phase shifter mask) of the contact opening in which the pinhole is present.
Figure 10B:
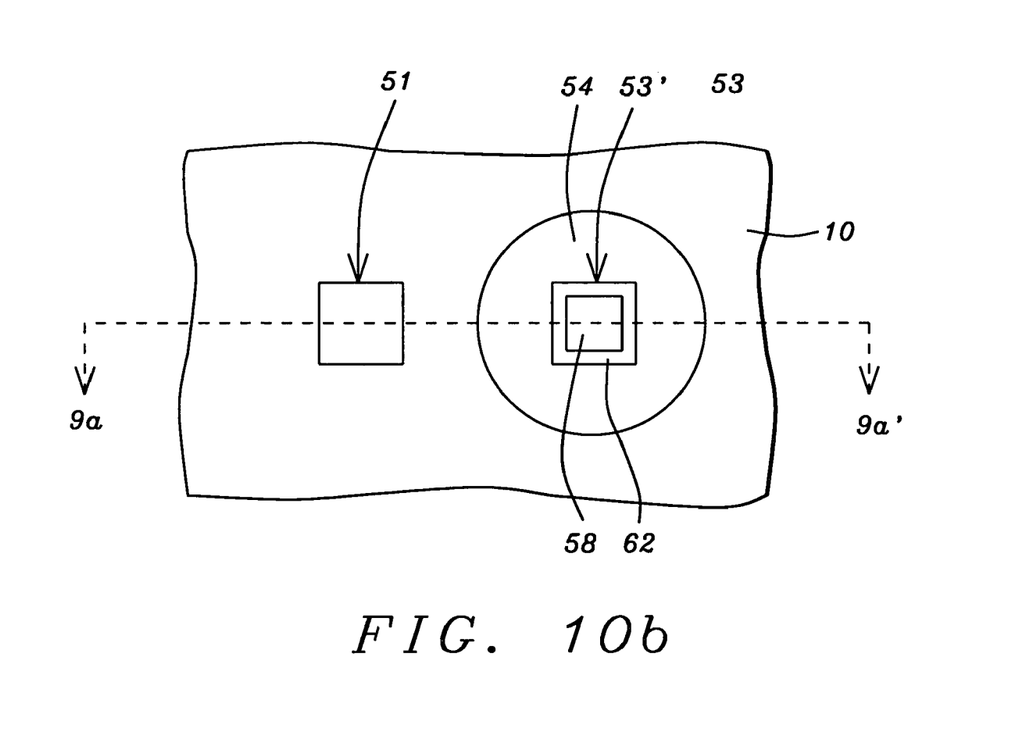

The etch of double trenches is shown in FIGS. 10a and 10b, where in the structure that has been discussed using FIGS. 8a and 8b, the double trenches 62 have been etched into substrate 10 where this substrate is exposed in opening 53', creating the opening 60', which comprises the double trench etch 62. The area highlighted as area 64 is the area of the substrate 10 that is surrounded by the double trenches 62.

For this method of repairing the pinhole 53, as shown in FIGS. 10a and 10b, the results are that the contact created by the repaired opening 60' provides the required phase shifting function while the depth of focus and the process window of the opening 60' is the same as the normal contact opening 51.

FIG. 10b shows a top view corresponding to the cross section of FIG. 10a, the cross section shown in FIG. 10a has been taken along the line 10a–10a' shown in FIG. 10b.

The cross sections and top views that are shown in FIGS. 6a through 10b highlight:

a normal attenuated phase shifter mask in which no pinhole is present, FIGS. 6a and 6b.

the occurrence of a pinhole in a contact opening, FIGS. 7a and 7b the conventional repair of a pinhole, FIGS. 8a and 8b, by depositing a layer of material around the perimeter of a contact opening in which the pinhole is present providing a single trench etch, FIGS. 9a and 9b, in the exposed surface of the substrate (of the attenuated phase shifter mask) of the contact opening in which the pinhole is present providing a double trench etch, FIGS. 10a and 10b, in the exposed surface of the substrate (of the attenuated phase shifter mask) of the contact opening in which the pinhole is present.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of repairing defects in an attenuated phase shifter mask, comprising:

providing an attenuated phase shifter mask, the attenuated phase shifter mask comprising a transparent substrate over which a patterned layer of phase shifter material has been created;

identifying a defective area of the phase shifter material;

removing the phase shifter material from the defective area;

depositing opaque material on the defective area of the attenuated phase shifter mask; and etching a single trench into the transparent substrate of the attenuated phase shifter mask aligned with the defective area to provide a phase shift angle, the trench location and dimensions comprising an exposure pattern.

2. The method of claim 1, the transparent substrate comprising quartz.

3. The method of claim 1, a depth of the single trench being about 238.5 nm for exposure wavelength of 248 nm.

4. The method of claim 1, a depth of the single trench being about 172.3 nm for exposure wavelength of 193 nm.

5. The method of claim 1, the phase shift angle being about 180 degrees.

6. The method of claim 1, wherein said attenuated phase shifter mask is for contact layer patterning.

7. A method of repairing defects in an attenuated phase shifter mask, comprising:

providing an attenuated phase shifter mask, the attenuated phase shifter mask comprising a transparent substrate over which a patterned layer of phase shifter material has been created;

identifying a defective area of the phase shifter material;

removing the phase shifter material from the defective area; and etching a double trench into the transparent substrate of the attenuated phase shifter mask aligned with the defective area to provide a phase shift angle, wherein the double trench is located at an edge of an exposure pattern, wherein the double trench farther has dimensions being smaller than dimensions of the exposure pattern.

8. The method of claim 7, the substrate comprising quartz.

9. The method of claim 7, a depth of the double trench being about 238.5 nm for exposure wavelength of 248 nm.

10. The method of claim 7, a depth of the double trench being about 172.3 nm for exposure wavelength of 193 nm.

11. The method of claim 7, the phase shift angle being about 180 degrees.

12. The method of claim 7, wherein said attenuated phase shifter mask is for contact layer patterning.

13. A method of repairing defects in an attenuated phase shifter mask, comprising:
   providing an attenuated phase shifter mask, the attenuated phase shifter mask comprising a transparent substrate over which a patterned layer of phase shifter material has been created;
   identifying a defective area of the phase shifter material;
   removing the phase shifter material from the defective area;
   depositing opaque material on the defective area; and
   etching a double trench into the transparent substrate of the attenuated phase shifter mask aligned with the defective area to provide a phase shift angle, wherein the double trench is located at an edge of an exposure pattern, wherein the double trench farther has dimensions being smaller than dimensions of the exposure pattern.

14. The method of claim 13, the substrate comprising quartz.

15. The method of claim 13, a depth of the double trench being about 238.5 nm for exposure wavelength of 248 nm.

16. The method of claim 13, a depth of the double trench being about 172.3 nm for exposure wavelength of 193 nm.

17. The method of claim 13, the phase shift angle being about 180 degrees.

18. The method of claim 13, wherein said attenuated phase shifter mask is for contact layer patterning.

* * * * *